US009165874B2

(12) United States Patent
Furuhata

(10) Patent No.: US 9,165,874 B2
(45) Date of Patent: Oct. 20, 2015

(54) SEMICONDUCTOR DEVICE, METHOD OF MANUFACTURING SEMICONDUCTOR DEVICE, AND ELECTRONIC APPARATUS

(71) Applicant: Seiko Epson Corporation, Tokyo (JP)

(72) Inventor: Makoto Furuhata, Matsumoto (JP)

(73) Assignee: Seiko Epson Corporation (JP)

(*) Notice: Subject to any disclaimer, the term of this patent is extended or adjusted under 35 U.S.C. 154(b) by 7 days.

(21) Appl. No.: 13/860,107

(22) Filed: Apr. 10, 2013

(65) Prior Publication Data
US 2013/0270707 A1 Oct. 17, 2013

(30) Foreign Application Priority Data

Apr. 11, 2012 (JP) ................. 2012-089966

(51) Int. Cl.
H01L 29/24 (2006.01)
G01C 19/56 (2012.01)
H01L 23/498 (2006.01)
H01L 21/768 (2006.01)
B81B 3/00 (2006.01)

(52) U.S. Cl.
CPC .......... H01L 23/498 (2013.01); B81B 3/0086 (2013.01); H01L 21/76802 (2013.01); B81B 2207/07 (2013.01); H01L 2924/0002 (2013.01)

(58) Field of Classification Search
CPC ............. H01L 2924/14; H01L 2924/01079; H01L 2924/01013; H01L 2924/01029; H01L 2924/01078; G01C 19/56; G01C 19/5719; G01C 19/5607; G01C 19/5649; G01C 19/5642; G01C 19/5663; G01C 19/5635

USPC ........... 257/622, 773, 774, 57, 56, 59, 72, 257/347–354, 754–756; 73/504.12, 504.14, 73/504.04

See application file for complete search history.

(56) References Cited

U.S. PATENT DOCUMENTS

| 5,627,317 | A | 5/1997 | Offenberg et al. |
| 5,719,073 | A | 2/1998 | Shaw et al. |
| 5,825,092 | A * | 10/1998 | Delgado et al. ............... 257/778 |
| 6,170,332 | B1 | 1/2001 | MacDonald et al. |
| 6,171,881 | B1 | 1/2001 | Fujii |
| 6,383,864 | B2 * | 5/2002 | Scheller et al. ............... 438/243 |
| 6,388,300 | B1 | 5/2002 | Kano et al. |
| 6,494,096 | B2 | 12/2002 | Sakai et al. |
| 2001/0013253 | A1 * | 8/2001 | Hashimoto ................ 73/504.12 |

(Continued)

FOREIGN PATENT DOCUMENTS

| JP | 05-304303 | 11/1993 |
| JP | 07-333078 | 12/1995 |

(Continued)

OTHER PUBLICATIONS

Denso Technical Review, vol. 5, No. 1, 2000, pp. 39-44.

*Primary Examiner* — Steven Loke
*Assistant Examiner* — Didarul Mazumder
(74) *Attorney, Agent, or Firm* — Harness, Dickey & Pierce, P.L.C.

(57) ABSTRACT

A semiconductor device includes a base substrate and first and second semiconductor wires which are arranged side by side on the base substrate, and the base substrate is provided with an opening (inter-wire grove, slit) in an extending direction of the first and second semiconductor wires between the first semiconductor wire and the second semiconductor wire.

6 Claims, 14 Drawing Sheets

(56) References Cited

U.S. PATENT DOCUMENTS

| | | | |
|---|---|---|---|
| 2003/0129798 A1* | 7/2003 | Saenger et al. | 438/243 |
| 2004/0147074 A1* | 7/2004 | Sell et al. | 438/243 |
| 2005/0167656 A1* | 8/2005 | Sun et al. | 257/30 |
| 2007/0155119 A1* | 7/2007 | Muemmler et al. | 438/424 |
| 2011/0133150 A1* | 6/2011 | Lung et al. | 257/3 |
| 2011/0298045 A1* | 12/2011 | Kalnitsky et al. | 257/331 |
| 2013/0168812 A1* | 7/2013 | Lee et al. | 257/532 |

FOREIGN PATENT DOCUMENTS

| | | |
|---|---|---|
| JP | 08-506857 | 7/1996 |
| JP | 2000-286430 | 10/2000 |
| WO | 94-18697 | 8/1994 |

* cited by examiner

SEMICONDUCTOR DEVICE, METHOD OF MANUFACTURING SEMICONDUCTOR DEVICE, AND ELECTRONIC APPARATUS

BACKGROUND

1. Technical Field

The present invention relates to a semiconductor device, a method of manufacturing a semiconductor device, and an electronic apparatus, and particularly, to a technology of reducing a parasitic capacitance.

2. Related Art

In recent years, technologies of forming a small-sized high-sensitivity semiconductor device on a base substrate using a micro electro mechanical system (MEMS) technology and forming wires which are connected to the semiconductor device on the base substrate together with the formation of the semiconductor device have attracted attention.

As such a method of manufacturing a semiconductor device, for example, a silicon substrate which is a material of a semiconductor device is bonded to a base substrate made of glass or the like through anodic bonding, and subjected to etching except for an area which forms constituent elements of the semiconductor device of the silicon substrate and an area which forms semiconductor wires which are connected to the constituent elements to die-cut the constituent elements and the semiconductor wires to thereby obtain a semiconductor device.

In addition, as another manufacturing method, in DENSO Technical Review, Vol. 5, No. 1, 2000, pages 39 to 44, a silicon-on-insulator (SOI) substrate is used as a base substrate for a semiconductor device, and a configuration is disclosed in which in a semiconductor device having constituent elements arranged on a SOI substrate, wires made of polysilicon for connection to constituent elements are embedded in the SOI substrate and connected to constituent elements of connection destinations. In DENSO Technical Review, Vol. 5, No. 1, 2000, pages 39 to 44, the SOI substrate has a $SiO_2$ layer which is positioned below the position at which the wires are embedded.

However, the wires are arranged adjacent to the glass substrate of $SiO_2$ or the $SiO_2$ layer in any of the above-described methods. $SiO_2$ has a high specific permittivity. Accordingly, when the wires are arranged adjacent to $SiO_2$, a parasitic capacitance (stray capacitance) is easily generated between the wires. Accordingly, in any method, there is a tendency that electrical characteristics of the semiconductor device are adversely affected due to the parasitic capacitance between the wires.

SUMMARY

An advantage of some aspects of the invention is that it provides a semiconductor device having a reduced parasitic capacitance, a method of manufacturing a semiconductor device, and an electronic apparatus.

The invention can be implemented as the following application examples.

APPLICATION EXAMPLE 1

This application example is directed to a semiconductor device including: a base substrate; and first and second semiconductor wires which are arranged side by side on the base substrate, in which the base substrate is provided with an opening in an extending direction of the first and second semiconductor wires between the first semiconductor wire and the second semiconductor wire.

With the above-described configuration, an opening is formed in an area in the base substrate through which electric force lines emitted from the semiconductor wires pass. Accordingly, the specific permittivity of the part through which the electric force lines pass in the base substrate can be reduced, and thus a semiconductor device is obtained in which a parasitic capacitance between the semiconductor wires is reduced.

APPLICATION EXAMPLE 2

This application example is directed to the semiconductor device according to Application Example 1, wherein a relationship of $D \geq 2W$ is satisfied where D represents a depth of the opening and W represents a width between a center portion of a width of the first semiconductor wire and a center portion of a width of the second semiconductor wire.

With the above-described configuration, the parasitic capacitance between the semiconductor wires can be more effectively reduced.

APPLICATION EXAMPLE 3

This application example is directed to the semiconductor device according to Application Example 1, wherein a material of the base substrate is glass and a material of the semiconductor wire is silicon.

With the above-described configuration, the semiconductor device can be formed with a simple configuration.

APPLICATION EXAMPLE 4

This application example is directed to the semiconductor device according to Application Example 1, wherein the opening has a bottom.

With the above-described configuration, when a cap is bonded to the base substrate to cover the semiconductor wires, the semiconductor wires can be sealed airtight and contamination of the semiconductor wires can be prevented.

APPLICATION EXAMPLE 5

This application example is directed to an electronic apparatus including: the semiconductor device according to Application Example 1.

For the same reason as Application Example 1, the electronic apparatus is obtained in which a parasitic capacitance between the semiconductor wires is reduced.

APPLICATION EXAMPLE 6

This application example is directed to a method of manufacturing a semiconductor device, including: arranging first and second semiconductor wires side by side on an insulating substrate; and forming an opening extending in an extending direction of the first and second semiconductor wires between the first semiconductor wire and the second semiconductor wire by subjecting the insulating substrate to etching using the first and second semiconductor wires as a mask pattern.

With the above-described method, a semiconductor device in which an opening is securely disposed between the semiconductor wires can be manufactured without generating an alignment error which can occur when the opening is formed in advance on the base substrate and the semiconductor wires are then arranged on the base substrate.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
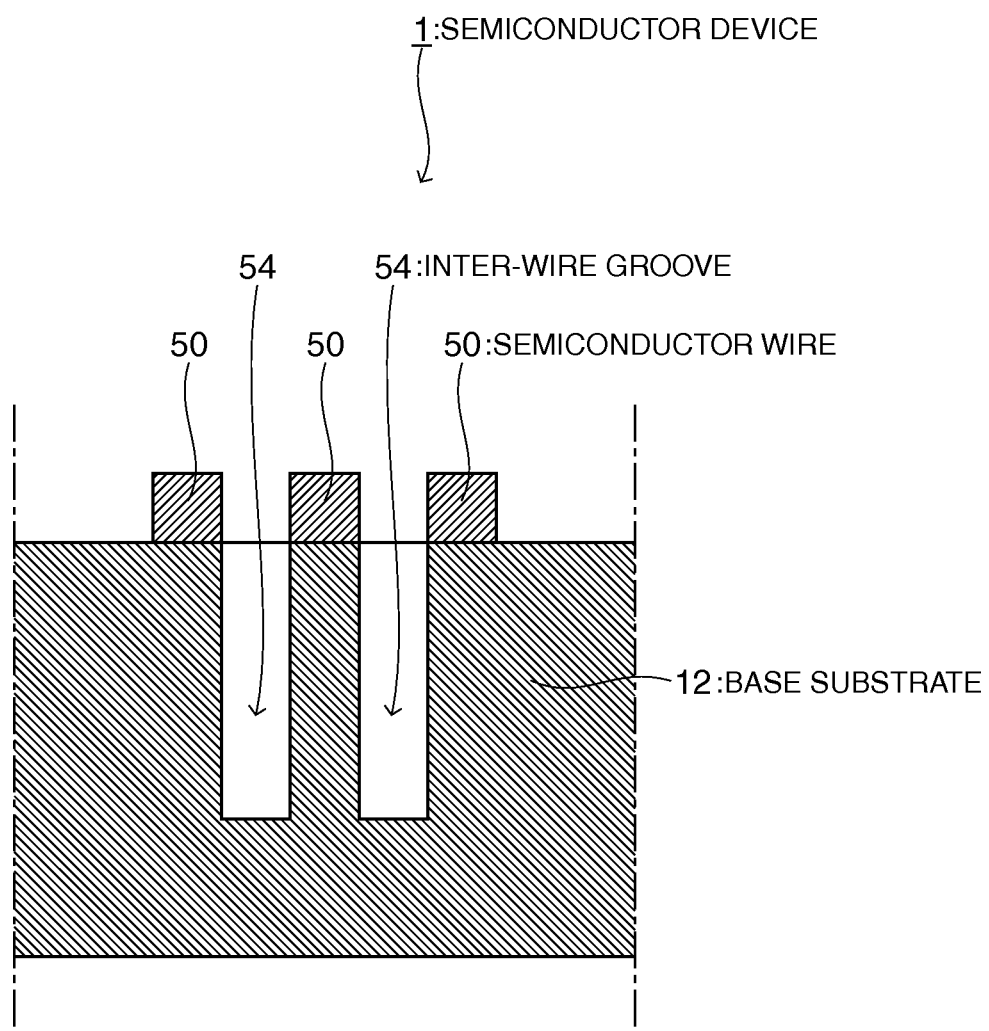
FIG. 1 is a cross-sectional view of a semiconductor device of an embodiment.

Hereinafter, the invention will be described in detail with reference to embodiments illustrated in the drawings. However, constituent elements, kinds, combinations, shapes, relative arrangements thereof, and the like described in the embodiments are not intended to limit the scope of the invention, but exemplified only for the purpose of describing the invention unless otherwise stated. A semiconductor device of the embodiment of the invention is applied to, for example, a gyro sensor 10 illustrated in FIG. 7 and other drawings. However, the content of the invention will be clearly described using FIGS. 1 to 6 before descriptions about the gyro sensor.

Figure 2:
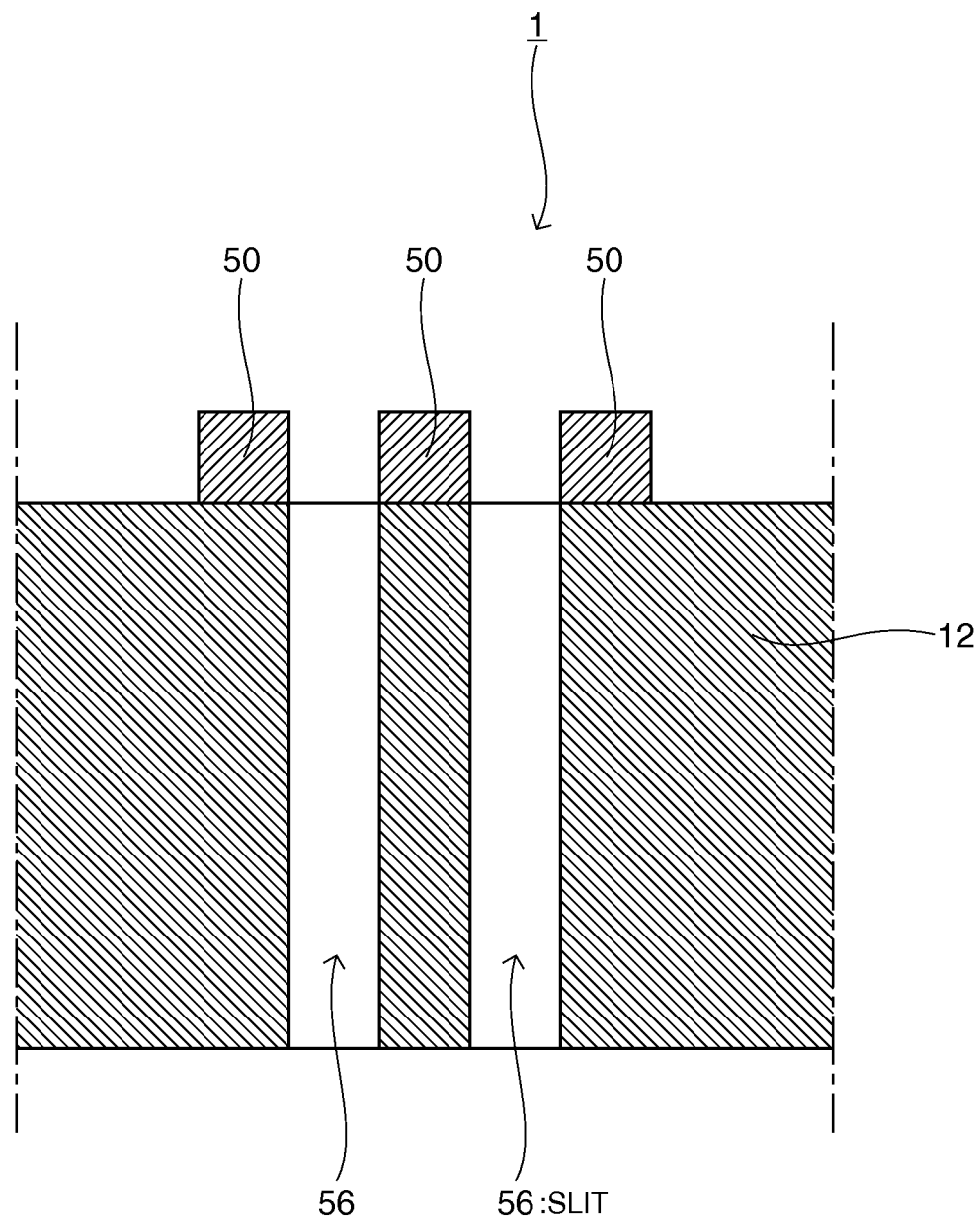
FIG. 2 is a cross-sectional view of a modification example of the semiconductor device of the embodiment.

FIG. 1 illustrates a cross-sectional view of a semiconductor device of an embodiment, and FIG. 2 illustrates a cross-sectional view of a modification example of the semiconductor device of the embodiment. A semiconductor device 1 of the embodiment has a configuration in which a plurality of semiconductor wires 50 (see FIG. 7) are arranged on a base substrate 12 (see FIG. 7). The base substrate 12 has openings (inter-wire grooves 54 (FIG. 1) or slits 56 (FIG. 2)) which are provided in an extending direction of the semiconductor wire 50 between the semiconductor wires 50.

The base substrate 12 is made of glass. The semiconductor wire 50 is made of conductive silicon. When a semiconductor wire 50 and a semiconductor wire 50 are not at the same potential, an electric field is generated between the semiconductor wires, and thus it is possible to draw electric force lines (direction of the electric field) which connect the semiconductor wires 50 to each other. The electric force lines include components passing on the base substrate 12 and components passing through the base substrate 12.

When the material of the base substrate 12 is glass, the permittivity thereof is higher than that of the vacuum. Accordingly, when two semiconductor wires 50 are regarded as a condenser, a component which is an electrostatic capacitance of the condenser and includes the electric force line passing through the base substrate 12 becomes larger than a component which includes the electric force line passing on the base substrate 12. Accordingly, the parasitic capacitance between the semiconductor wires 50 increases. In addition, the smaller the distance between the semiconductor wires 50, the larger the parasitic capacitance.

Accordingly, as illustrated in FIG. 1, the semiconductor device 1 of the embodiment is provided with an inter-wire groove 54 (opening) on a position between semiconductor wires 50 of the base substrate 12 which are adjacent to each other. Therefore, an electric force line can be allowed to pass through the inter-wire groove 54 and an average specific permittivity of the area through which the electric force line passes in the base substrate 12 can thus be reduced, thereby reducing the parasitic capacitance between the semiconductor wires 50.

In addition, as illustrated in FIG. 2, a slit 56 (opening) which penetrates through the base substrate 12 may be formed in place of the inter-wire groove 54. Therefore, since of the electric force lines radiated from the semiconductor wires 50, a component passing through the material of the base substrate 12 can be reduced compared to the case in which the inter-wire groove 54 is formed on the same base substrate 12, and the parasitic capacitance between the wires can be further reduced.

A process of manufacturing the semiconductor device of the embodiment includes the steps of: forming the inter-wire grooves 54 (or slits 56) on the base substrate 12; and bonding the semiconductor wires 50 to the base substrate 12 so as to interpose the inter-wire groove 54 between the semiconductor wires. However, the semiconductor device can also be manufactured as follows.

Figure 3:
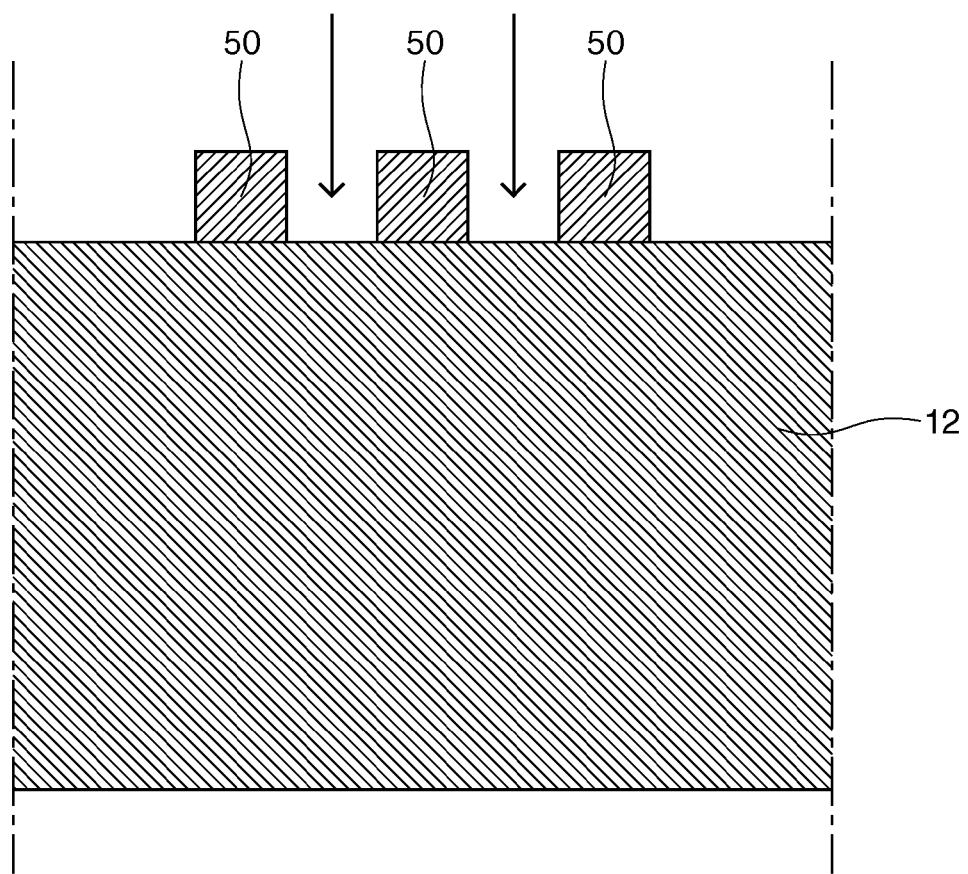
FIG. 3 is a cross-sectional view illustrating a process of manufacturing the semiconductor device of the embodiment (before etching).
Figure 4:
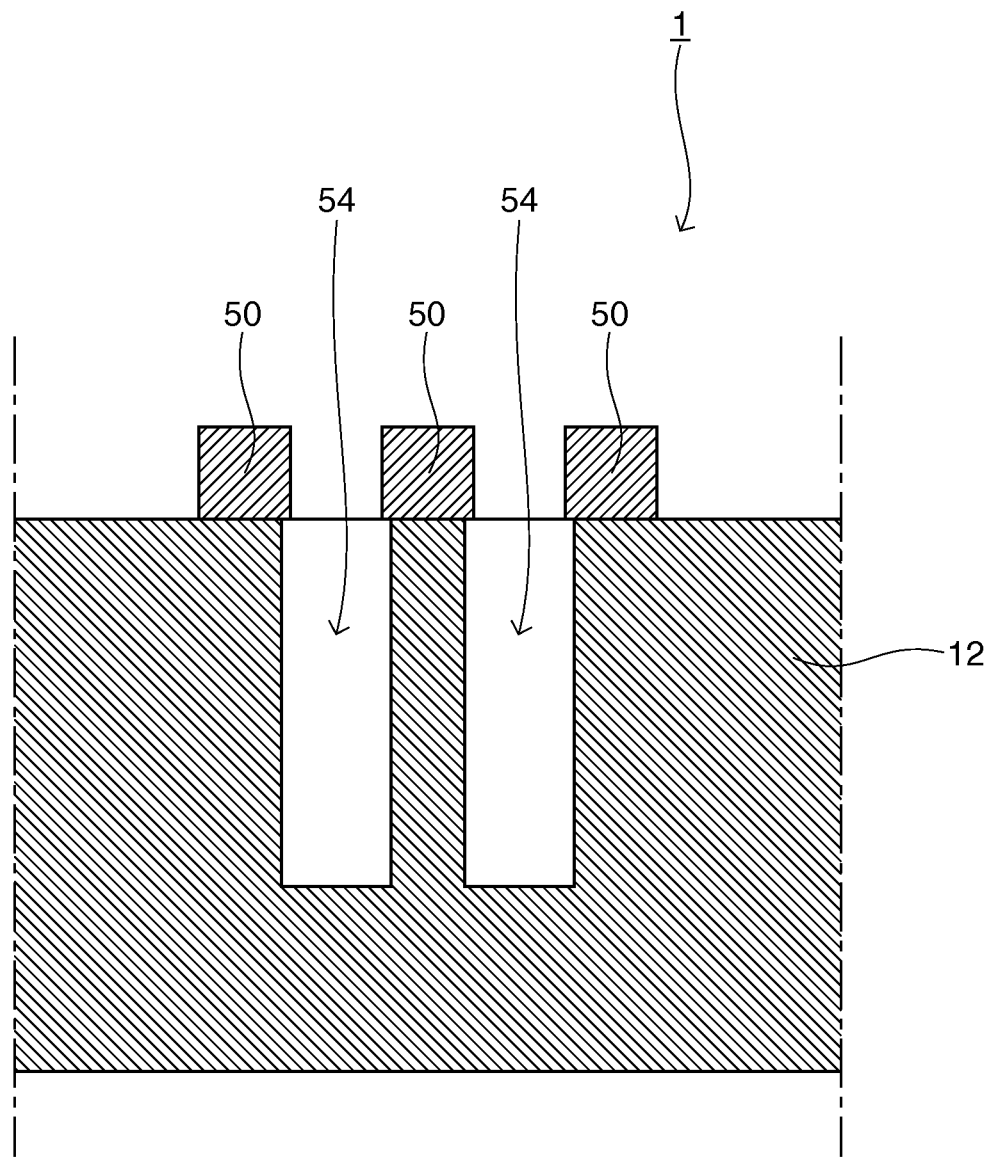
FIG. 4 is a cross-sectional view illustrating a process of manufacturing the semiconductor device of the embodiment (after etching).

FIGS. 3 and 4 illustrate a process of manufacturing the semiconductor device of the embodiment. The semiconductor wires 50 are arranged on the base substrate 12 as illustrated in FIG. 3. Regarding the arrangement of the semiconductor wires 50, a silicon substrate 52 (FIG. 13) may be bonded to the base substrate 12 as will be described later, and subjected to etching in accordance with the arrangement of the semiconductor wires 50 to die-cut the semiconductor wires 50. In addition, dry etching or wet etching is performed on an area between the semiconductor wires 50 of the base substrate 12 using the semiconductor wires 50 as a mask pattern. Therefore, as illustrated in FIG. 4, the inter-wire groove 54 (or slit 56) is formed on the position between the semiconductor wires 50 of the base substrate 12. Here, the inter-wire groove 54 (or slit 56) has an outer shape according to the outer shape of the area between the semiconductor wires 50 of the base substrate 12 and is formed in the extending direction of the semiconductor wire 50.

When the inter-wire groove 54 is formed after arrangement of the semiconductor wires 50 on the base substrate 12, the etching proceeds not only in a thickness direction of the base substrate 12, but also in an in-plane direction of the base substrate 12. Accordingly, as illustrated in FIG. 4, when the inter-wire groove 54 is formed during the above-described manufacturing process, the semiconductor wires 50 are arranged to slightly protrude toward the inter-wire groove 54 in plan view.

Next, a depth of the inter-wire groove 54 sufficient for reducing the parasitic capacitance between the semiconductor wires 50 is examined. The parasitic capacitance between the semiconductor wires 50 is synonymous with the electrostatic capacitance between the semiconductor wires 50. Accordingly, a simple model is thought for calculating the electrostatic capacitance between the semiconductor wires 50.

Figure 5:
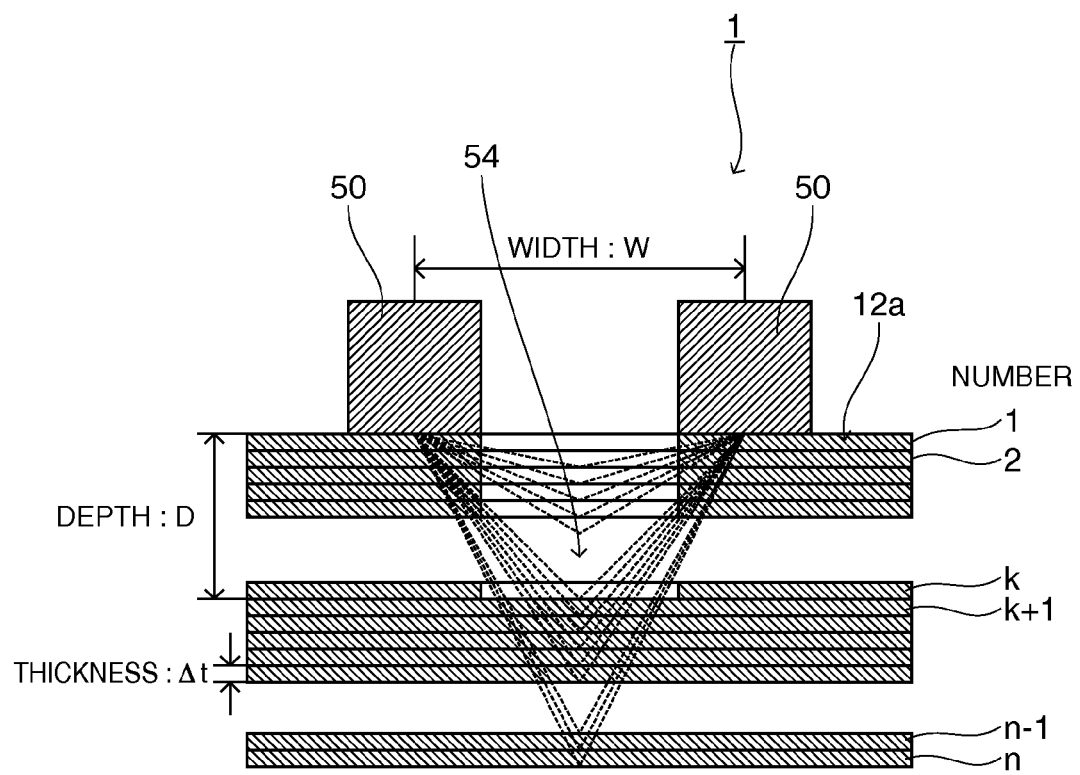
FIG. 5 is a view illustrating a model for calculating an electrostatic capacitance between semiconductor wires in the semiconductor device of the embodiment.

FIG. 5 illustrates a model for calculating the electrostatic capacitance between the semiconductor wires in the semiconductor device of the embodiment. n (n: integer) thin plates 12a obtained by slicing the base substrate 12 of the semiconductor device 1 for each thickness $\Delta t$ are thought as illustrated in FIG. 5. In addition, it is thought that an inter-wire groove 54 is formed up to a k-th (k<n) thin plate 12a. At this time, a depth D of the inter-wire groove 54 is k×$\Delta t$.

Electric force lines are drawn so as to be emitted from all of the surfaces of the semiconductor wires 50. However, for simplification of the model, it is thought that the electric force lines which are radiated from the surfaces of the semiconductor wires 50 other than lower surfaces which are bonded to the base substrate 12 do not pass through the base substrate 12, but only the electric force lines which are emitted from the lower surfaces of the semiconductor wires 50 pass through the base substrate 12. In addition, it is thought that in the lower surfaces, the electric force lines are radiated only from the center portions of the lower surfaces of the semiconductor wires 50.

In addition, it is thought that of the electric force lines, a component passing through the base substrate 12 draws a V-path in which the component is linearly emitted from the center portion of the lower surface of one semiconductor wire 50, bends on the lower surface of each thin plate 12a, and is linearly focused to the center portion of the lower surface of the other semiconductor wire 50 as illustrated in FIG. 5.

For further simplification of the model, it is thought that all of electric force lines bending on a lower surface of an i-th (i<k) thin plate 12a pass through the inter-wire groove 54 (in the vacuum) and do not pass through the material of the base substrate 12. Similarly, it is thought that all of electric force lines bending on a lower surface of an i-th (i>k) thin plate 12a pass through the material of the base substrate 12 and do not pass through the inter-wire groove 54.

A small electrostatic capacitance $\Delta C_1$ which is formed by an i-th (i<k) electric force line is as follows by the above-described model.

$$\Delta C_1 = \frac{\varepsilon_0 \times S}{\sqrt{(i \times \Delta t)^2 + \left(\frac{W}{2}\right)^2}} \qquad \text{Expression 1}$$

Here, $\varepsilon_0$ represents a permittivity of the vacuum, S represents an area of the lower surface of the semiconductor wire 50 per unit length of the semiconductor wire 50 in a longitudinal direction, and W represents a width between the center portions of the semiconductor wires 50. Similarly, a small electrostatic capacitance $\Delta C_2$ which is formed by an i-th (k<i) electric force line is as follows.

$$\Delta C_2 = \frac{\varepsilon_0 \times \varepsilon_r \times S}{\sqrt{(i \times \Delta t)^2 + \left(\frac{W}{2}\right)^2}} \qquad \text{Expression 2}$$

Here, $\varepsilon_r$ represents a specific permittivity of the material of the base substrate 12. Accordingly, a component which is an electrostatic capacitance between the semiconductor wires 50 and includes the electric force line passing through the base substrate 12 is as follows.

$$C = \sum_{i=1}^{k} \Delta C_1 + \sum_{i=k+1}^{n} \Delta C_2 \qquad \text{Expression 3}$$

In Expression 3, when the depth D of the inter-wire groove 54 is increased, that is, when the value of k is increased, the value of C is reduced. Accordingly, an electrostatic capacitance C when the value of K is increased is calculated, and the depth of the inter-wire groove 54 when a reduction in the electrostatic capacitance is saturated with respect to the case in which k is increased is calculated. Therefore, the depth D of the inter-wire groove 54 sufficient for reducing the parasitic capacitance between the semiconductor wires 50 can be calculated.

Figure 6:
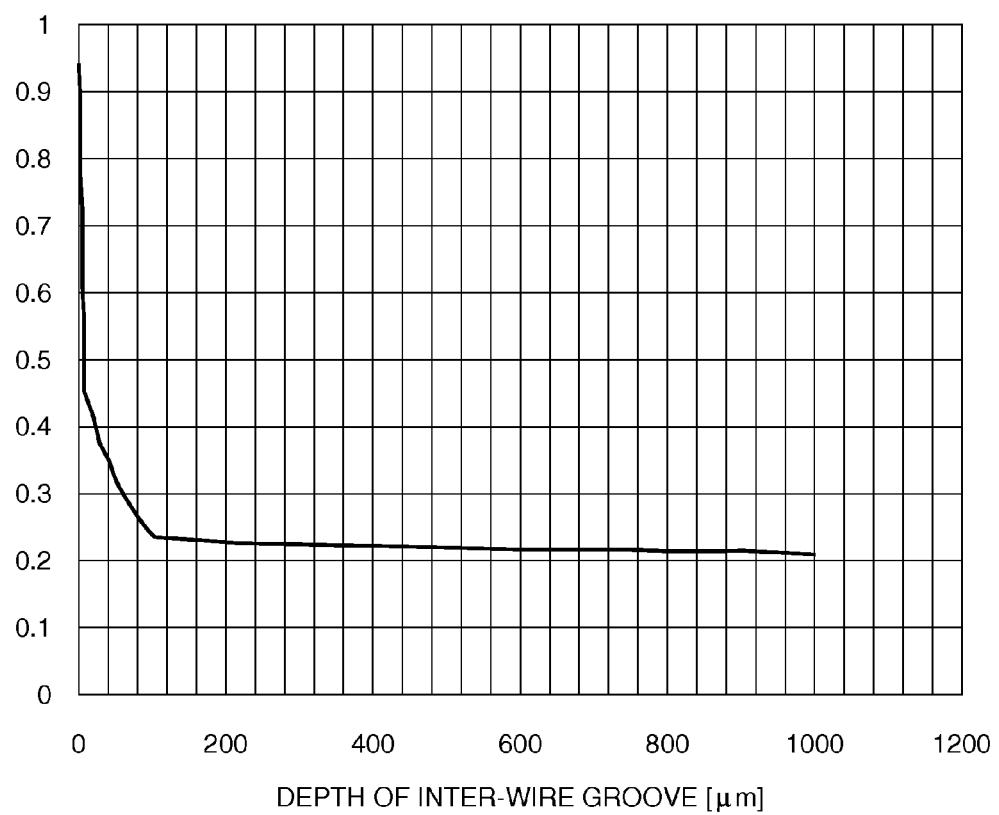
FIG. 6 is a graph which is obtained by calculating a change in the electrostatic capacitance between the semiconductor wires based on a change in the depth of an inter-wire groove on the basis of the model of FIG. 5.

FIG. 6 illustrates a graph which is obtained by calculating a change in the electrostatic capacitance between the semiconductor wires based on a change in the depth of the inter-wire groove on the basis of the model of FIG. 5. The inventors of the invention calculated a change in the electrostatic capacitance when changing the depth of the inter-wire groove 54 disposed on the base substrate 12 on the basis of the above-described model. In the above-described model, it is presumed that the base substrate 12 has a thickness of 1 mm and its material is Pyrex (registered trade name). The specific permittivity of Pyrex (registered trade name) is 4.8. In addition, it is presumed that a material of the semiconductor wire 50 is silicon and a width of the semiconductor wire 50 is 25 μm. Furthermore, it is presumed that a width between the semiconductor wires 50 is 25 μm and a width W between the center portions of the semiconductor wires 50 is 50 μm. A change in the electrostatic capacitance when changing the depth D of the inter-wire groove 54 from 0 to 1 μm was calculated. The vertical axis of the graph of FIG. 6 indicates a value obtained by dividing the above-described electrostatic capacitance by an electrostatic capacitance between the semiconductor wires 50 when there are no inter-wire grooves 54.

As illustrated in FIG. 6, the reduction in the electrostatic capacitance is saturated when the depth of the inter-wire groove 54 is 100 μm. Accordingly, it is found that the depth D of the inter-wire groove 54 necessary for sufficiently reducing the electrostatic capacitance between the semiconductor wires 50 is 100 μm or greater and the value of D is twice or greater the value of W.

In addition, in Expressions 1 and 2, the depth D (i×$\Delta t$) of the inter-wire groove 54 and the distance W between the center portions of the semiconductor wires 50 have the same order. Accordingly, the depth D of the inter-wire groove 54 necessary for sufficiently reducing the electrostatic capacitance between the semiconductor wires 50, and W at that time have a linear proportional relationship.

From the above fact, it is found that when D≥2 W is satisfied, the electrostatic capacitance between the semiconductor wires 50, that is, the parasitic capacitance can be sufficiently reduced.

Figure 7:
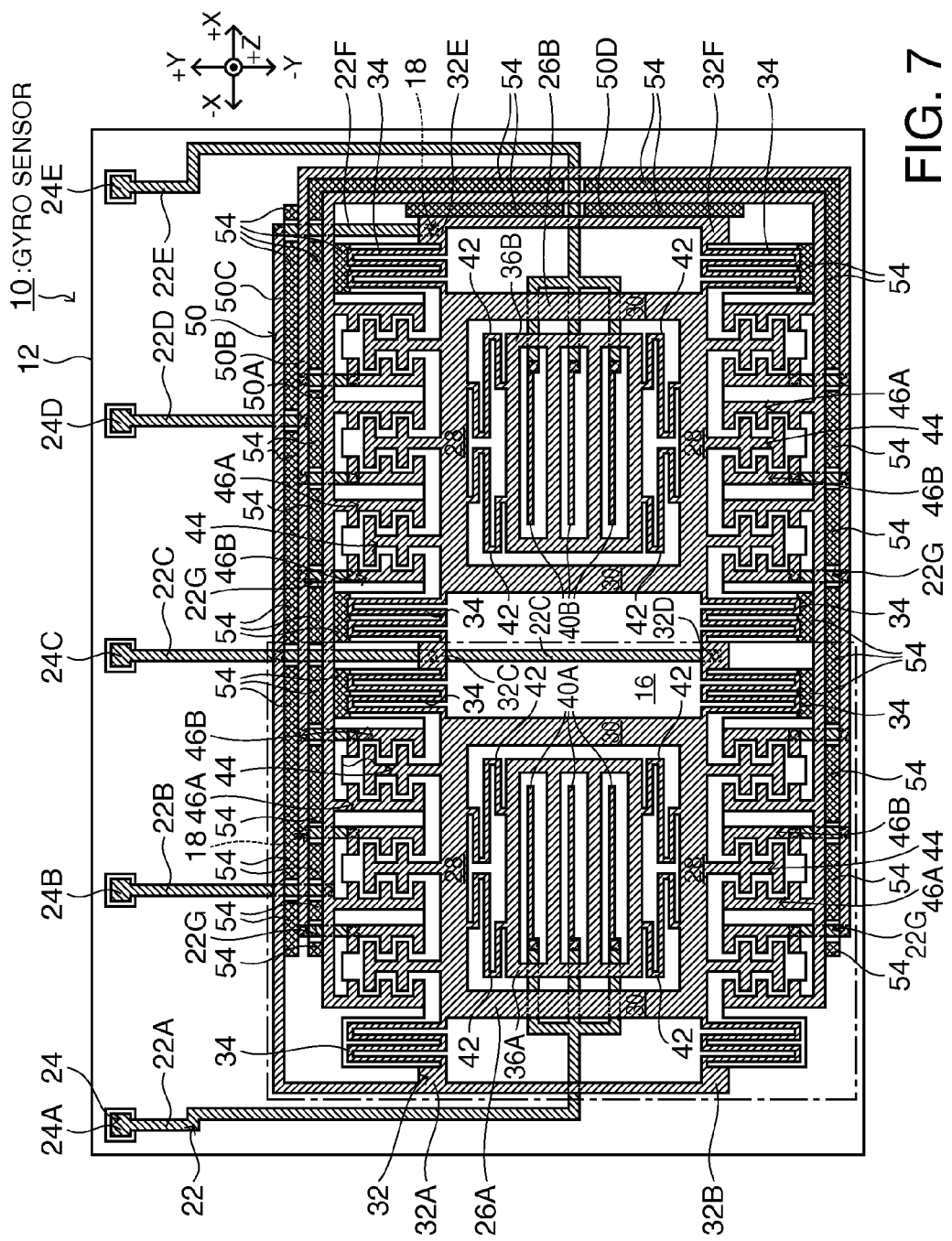
FIG. 7 is a plan view of a gyro sensor of the embodiment.
Figure 8:
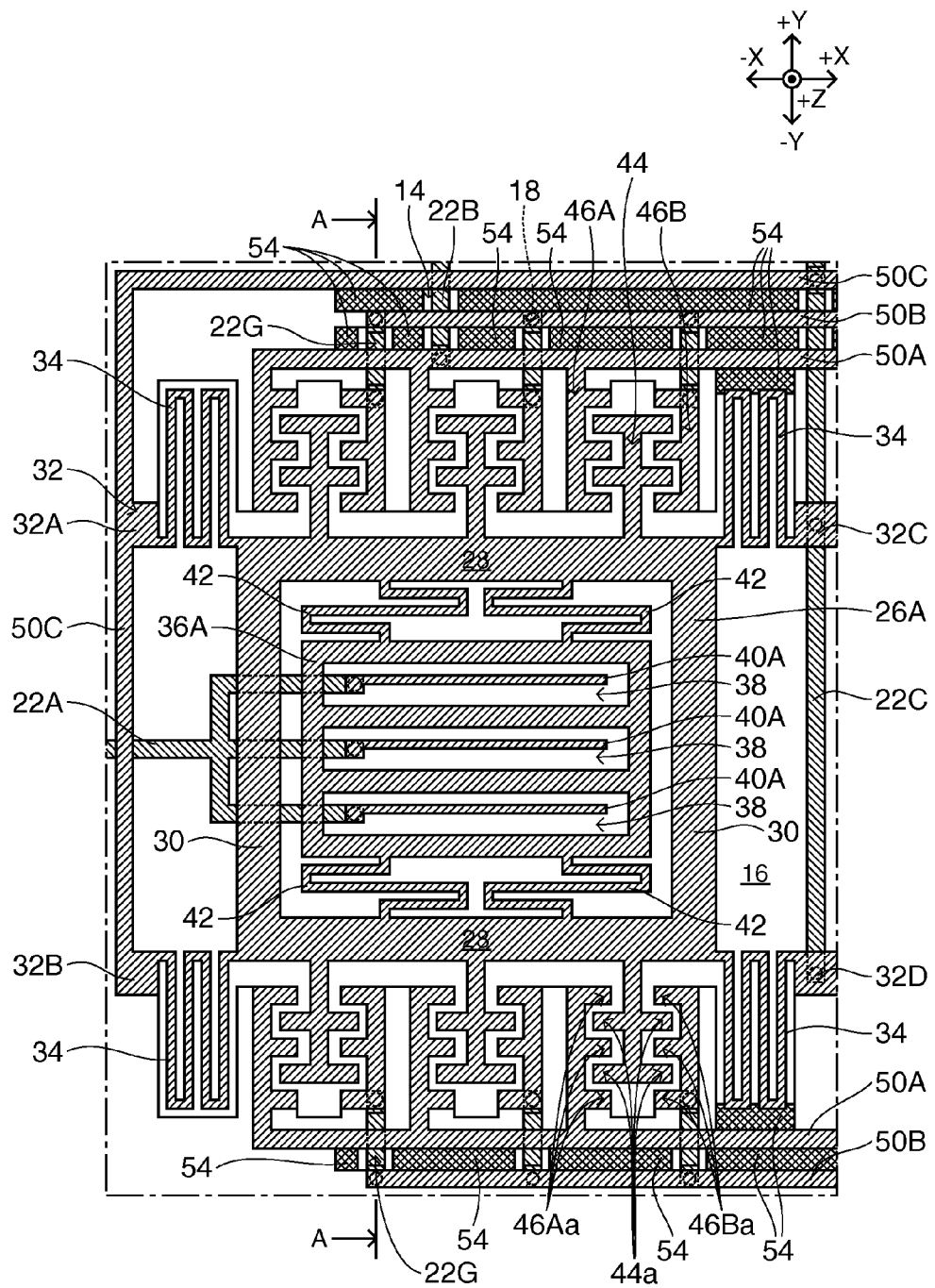
FIG. 8 is a detail view of the part surrounded by the dashed line of FIG. 7.
Figure 9:
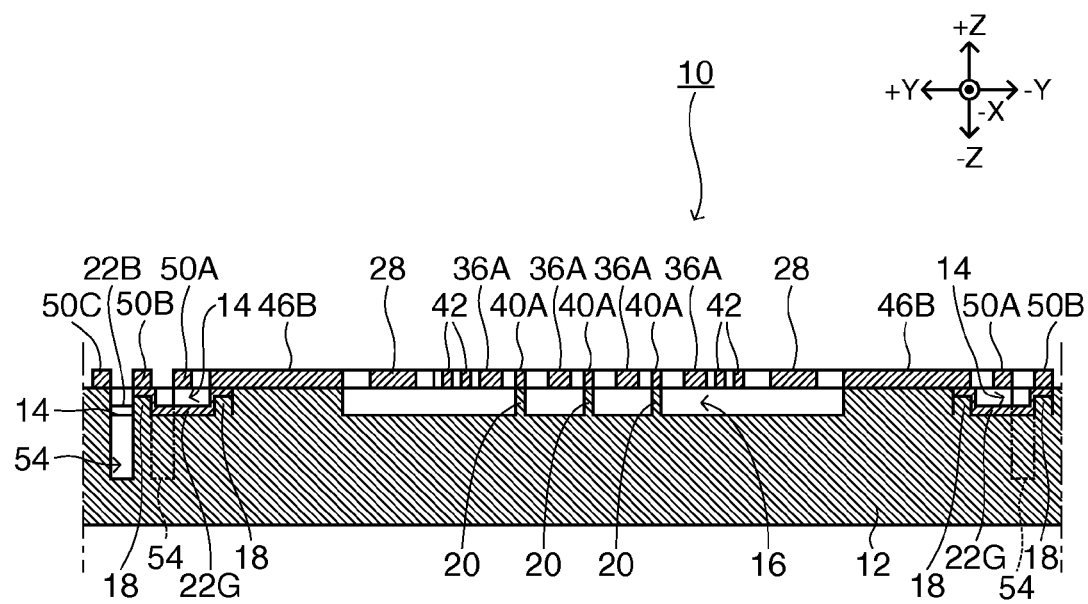
FIG. 9 is a cross-sectional view taken along the line A-A of FIG. 8.

FIG. 7 illustrates a plan view of a gyro sensor of the embodiment. FIG. 8 illustrates a detail view of the part surrounded by the dashed line of FIG. 7. FIG. 9 illustrates a cross-sectional view taken along the line A-A of FIG. 8. In the drawings, the X axis, the Y axis, and the Z axis are perpendicular to each other.

As illustrated in FIG. 7, in the gyro sensor 10 of the embodiment, a pair of drive mass portions 26A and 26B which are arranged in an X-axis direction (oscillation direction), a drive portion (movable electrode 44, fixed electrodes 46A and 46B) which oscillates the respective drive mass portions, a detector (movable mass portions 36A and 36B) which is supported by the drive mass portions 26A and 26B, and the like are integrally arranged on the base substrate 12. This integrated product is formed by performing die cutting from the conductive silicon substrate 52 to be described later.

In the embodiment, the elements are arranged substantially axisymmetrically with respect to a line in a Y-axis direction (conductive film 22C in FIG. 7) as a center line. First, a configuration of the embodiment will be described using the part (FIG. 8) surrounded by the dashed line of FIG. 7.

As illustrated in FIG. 8, the drive mass portion 26A has a rectangular casing shape. The drive mass portion 26A has first beam portions 28 which have a longitudinal direction in the X-axis direction and are parallel to each other and a pair of second beam portions 30 which have a longitudinal direction in the Y-axis direction and are parallel to each other. In addition, an anchor portion 32 (32A to 32D) is disposed on an extension in the longitudinal direction of the first beam portion 28 of the drive mass portion 26A. The drive mass portion 26A is connected to a drive spring 34 at an end of the first beam portion 28 in the longitudinal direction, so that the drive spring 34 is connected to each anchor portion 32. Accordingly, the drive mass portion 26A is electrically connected to the anchor portion 32 via the drive spring 34. The drive spring 34 is formed to have flexibility (be easily deformed) in the X-axis direction (oscillation direction) and to have constant rigidity (be difficult to deform) in the Y-axis direction (sensitive-axis direction).

The drive portion has a comb tooth-shaped movable electrode 44 extending from the drive mass portion 26A in the Y-axis direction and comb tooth-shaped fixed electrodes 46A and 46B which are bonded to the base substrate 12 with the movable electrode 44 sandwiched therebetween in the X-axis direction. An electrode finger 44a extends in the X-axis direction from the movable electrode 44 toward the fixed electrodes 46A and 46B. In addition, electrode fingers 46Aa and 46Ba extend in the X-axis direction from the fixed electrodes 46A and 46B toward the movable electrode 44. The electrode finger 44a extending from the movable electrode 44 and the electrode fingers 46Aa and 46Ba extending from the fixed electrodes 46A and 46B are alternately arranged side by side in the Y-axis direction.

The detector has a movable mass portion 36A and an island-shaped electrode 40A. The movable mass portion 36A is disposed inside the drive mass portion 26A and mechanically and electrically connected to the drive mass portion 26A via a detecting spring 42. The detecting spring 42 is formed to have flexibility in the Y-axis direction (sensitive-axis direction) and to have constant rigidity in the X-axis direction (oscillation direction). Accordingly, the movable mass portion 36A can be displaced in a direction cross (perpendicular) to the oscillation direction of the drive mass portion 26A on the base substrate 12.

The movable mass portion 36A has a rectangular casing shape with a plurality of slits 38 which have a longitudinal direction in the X-axis direction and are formed side by side at regular intervals in the Y-axis direction. The island-shaped electrode 40A is a member spatially separated from the movable mass portion 36A, and is disposed in each slit and bonded to the base substrate 12. Therefore, the island-shaped electrode 40A is disposed to be opposed to the movable mass portion 36A in the Y-axis direction. The detector has a detecting circuit (not shown) which is electrically connected to the movable mass portion 36A and the island-shaped electrode 40A and detects the electrostatic capacitance between the movable mass portion 36A and the island-shaped electrode 40A.

As illustrate in FIG. 7, the drive mass portion 26B is similar to the drive mass portion 26A, a movable mass portion 36B is similar to the movable mass portion 36A, and an island-shaped electrode 40B is similar to the island-shaped electrode 40A. Anchor portions 32E and 32F are similar to the anchor portions 32A and 32B. The drive spring 34 is interposed between the anchor portions 32B and 32D in the X-axis direction to support the drive springs 34.

The fixed electrodes 46A and 46B which are adjacent to the drive mass portion 26B on the right side of FIG. 7 are arranged opposite to each other in a horizontal direction with the fixed electrodes 46A and 46B and the movable electrode 44 as centers which are adjacent to the drive mass portion 26A on the left side of FIG. 7.

The base substrate 12 is made of an insulating material such as glass. Concave portions 16 (see FIG. 10) are provided at positions opposed to the drive spring 34, the drive mass portions 26A and 26B, the movable electrode 44, the detecting spring 42, the movable mass portions 36A and 36B, and the like on the base substrate 12. These constituent elements are supported by the anchor portion 32 while floating from bottom surfaces of the concave portions 16. Accordingly, the constituent elements can be displaced in the X-axis direction and the Y-axis direction on the base substrate 12 without causing interference with the base substrate 12.

The anchor portion 32 and the fixed electrodes 46A and 46B are bonded to the base substrate 12. Island portions 20 (see FIG. 10 and the like) having a shape according to the outer shape of the island-shaped electrodes 40A and 40B in plan view are arranged at positions opposed to the island-shaped electrodes 40A and 40B of the concave portion 16, and the island-shaped electrodes 40A and 40B are bonded to the island portions 20.

A semiconductor wire 50A which electrically connects the fixed electrodes 46A belonging to different drive portions, respectively, to each other, a semiconductor wire 50B which electrically connects the fixed electrodes 46B belonging to different drive portions, respectively, to each other, a semiconductor wire 50C which electrically connects the anchor portions 32A to 32D, and a semiconductor wire 50D which electrically connects the anchor portions 32E and 32F to each other are arranged on the base substrate 12.

Wire grooves 14 (see FIG. 10 and the like) are arranged on the base substrate 12 and extend up to positions opposed to the lower surfaces of the various electrodes and semiconductor wires which are connection destinations of a conductive film 22. The depth of the wire groove 14 can be made to be the same as that of the concave portion 16.

In the wire grooves 14, convex portions 18 are arranged at positions opposed to the various electrodes and semiconductor wires which are connection destinations of the conductive film 22. In addition, in the wire grooves 14, the conductive film 22 (22A to 22G) made of indium tin oxide (ITO) or the like is disposed to cover the surfaces of the bottom portion of the wire groove 14 and the surface of the convex portion 18 (see FIGS. 9 and 12). The upper surface of the convex portion 18 is substantially as high as the surface of the base substrate 12.

Accordingly, as illustrated in FIG. 9, the conductive film 22 is exposed from the surface of the base substrate 12 and connected to the various electrodes and semiconductor wires on the upper surface of the convex portion 18, but in other parts, the conductive film 22 is positioned below the surface of the base substrate 12, so that the conductive film 22 is not short-circuited or connected to other constituent elements in a part other than the upper surface of the convex portion 18.

As illustrated in FIG. 7, an external terminal 24 (24A to 24E) is disposed at an end of the conductive film 22. The external terminal 24A is electrically connected to the island-shaped electrode 40A via the conductive film 22A. The external terminal 24B is electrically connected to the semiconductor wire 50A via the conductive film 22B. Here, the semiconductor wire 50A is connected in parallel with the fixed electrode 46A. Therefore, the external terminal 24B is electrically connected to the fixed electrode 46A via the semiconductor wire 50A.

The external terminal 24C is electrically connected to the semiconductor wire 50C, the anchor portion 32B, and the anchor portion 32D via the conductive film 22C. Here, the semiconductor wire 50C is connected to the anchor portions 32A and 32B and electrically connected to the anchor portion 32E, the semiconductor wire 50D, and the anchor portion 32F via the conductive film 22F. Therefore, the external terminal 24C is electrically connected to the anchor portion 32.

The external terminal 24D is electrically connected to the semiconductor wire 50B via the conductive film 22D. Here, the semiconductor wire 50B is electrically connected in parallel with the fixed electrode 46B via the conductive film 22G. Accordingly, the external terminal 24D is electrically connected to the fixed electrode 46B via the semiconductor wire 50B and the conductive film 22G.

The external terminal 24E is electrically connected to the island-shaped electrode 40B via the conductive film 22E. A DC voltage and an AC voltage for driving the drive portion are applied to the external terminal 24B and the external terminal 24D. The external terminal 24A, the external terminal 24C, and the external terminal 24E are connected to the detecting circuit (not shown).

A DC voltage is applied to the fixed electrodes 46A and 46B and an AC voltage having an opposite phase is also applied thereto. Accordingly, the movable electrode 44 is attracted to a height position of the fixed electrodes 46A and 46B due to an electrostatic attractive force generated by the DC voltage components of the fixed electrodes 46A and 46B, and oscillates in the X-axis direction as an oscillation direction by the AC voltage components.

Therefore, the drive mass portion 26A, the movable electrode 44, the detecting spring 42, and the movable mass portion 36A oscillate in the X-axis direction as an oscillation direction, and the drive spring 34 is expanded and contracted and oscillates in the X-axis direction. Since the distance in the Y-axis direction between the movable mass portion 36A and the island-shaped electrode 40A does not change with this oscillation, the electrostatic capacitance therebetween does not change.

At this time, in the drive mass portions 26A and 26B, since the fixed electrodes 46A and 46B are arranged opposite to each other in the horizontal direction with the movable electrode 44 interposed therebetween, the drive mass portions 26A and 26B oscillate in phases opposite to each other in the X-axis direction as an oscillation direction. Therefore, the drive mass portions 26A and 26B bilaterally symmetrically oscillate on the base substrate 12. At this time, since there is no movement of the center of gravity associated with the oscillation, leakage of oscillation can be suppressed.

In the above-described oscillation state, when the angular velocity around the Z axis is applied, the movable mass portion 36A receives a Coriolis force which is displaced in the Y-axis direction. The detecting spring 42 receiving this force is expanded and contracted in the Y-axis direction, and the movable mass portion 36A is displaced in the Y-axis direction. Therefore, the distance between the island-shaped electrode 40A and the movable mass portion 36A (internal wall of the slit 38 on the +Y-axis side) changes, and the electrostatic capacitance between the island-shaped electrode 40A and the movable mass portion 36A changes. Accordingly, when this change in the electrostatic capacitance is monitored in the detecting circuit (not shown), the magnitude and direction of the angular velocity around the Z axis can be detected.

In addition, since the oscillation directions (X-axis direction) of the movable mass portions 36A and 36B are opposite to each other, the movable mass portions receive Coriolis forces in directions opposite to each other in the Y-axis direction. In addition, when receiving an acceleration in a direction parallel to the Y axis, the movable mass portions 36A and 36B receive an inertia force (acceleration) in the same direction in the Y-axis direction.

Accordingly, when taking a difference between the electrostatic capacitance between the movable mass portion 36A and the island-shaped electrode 40A and the electrostatic capacitance between the movable mass portion 36B and the island-shaped electrode 40B, the acceleration component in the direction parallel to the Y axis is offset, and thus a value which is obtained by adding the angular velocity components around the Z axis can be detected. Accordingly, it is possible to detect the angular velocity around the Z axis with high sensitivity.

As illustrated in FIG. 7 and the like, the inter-wire grooves 54 are arranged on the base substrate 12. The inter-wire grooves 54 are arranged in an area between the semiconductor wire 50A and the semiconductor wire 50B, an area between the semiconductor wire 50B and the semiconductor wire 50C, an area between the semiconductor wire 50B and the semiconductor wire 50D, and an area between the semiconductor wire 50A and the drive spring 34, respectively, on the base substrate 12. As described above, the depth D of the inter-wire groove 54 is required to satisfy the relationship of $D \geq 2W$ with the width W between the center portions of the semiconductor wires 50 which are adjacent to each other. Needless to say, a slit 56 (through hole, see FIG. 2) which penetrates through the base substrate 12 in the thickness direction may be formed in place of the inter-wire groove 54 at the position at which the inter-wire groove 54 of the base substrate 12 is formed.

Figure 10:
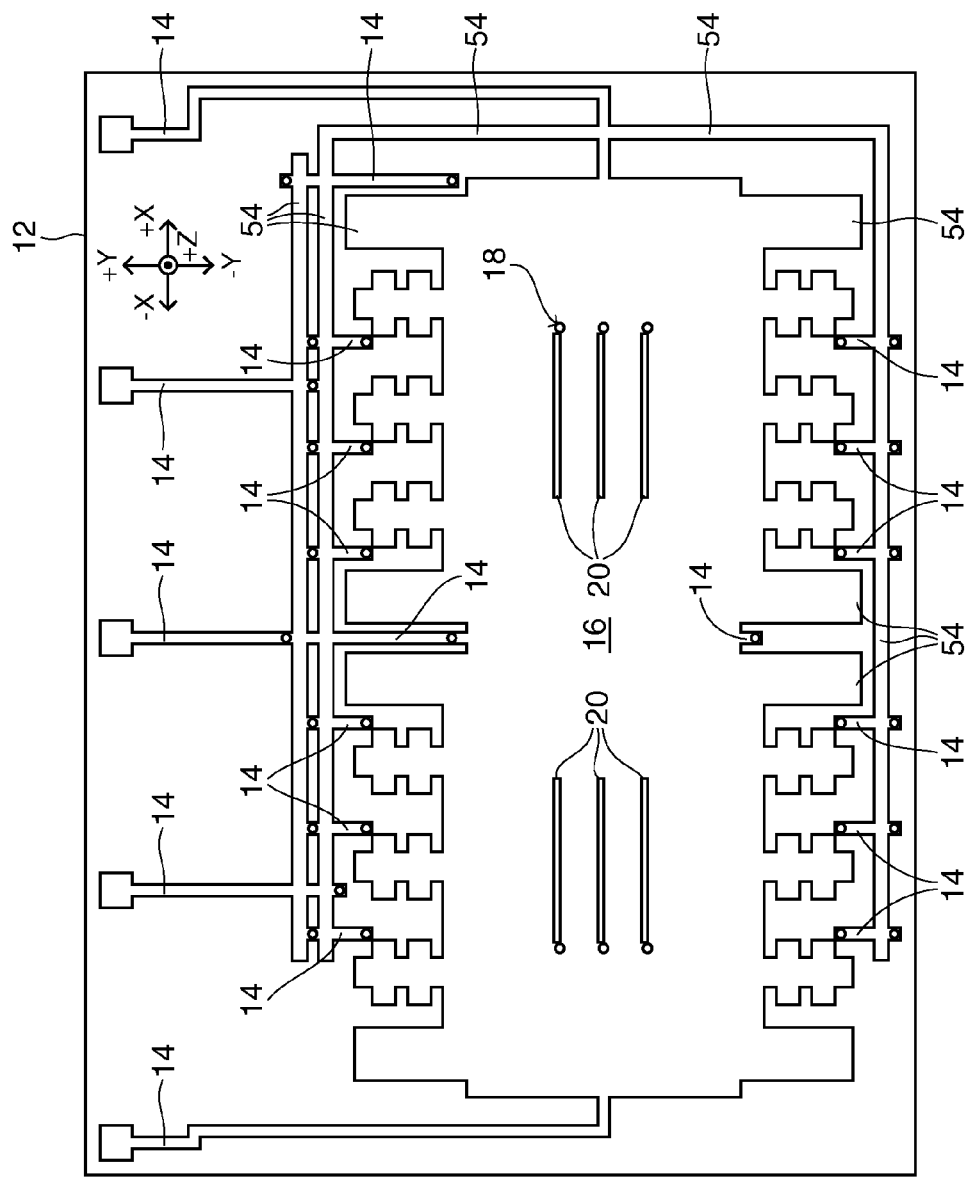
FIG. 10 is a view illustrating a process of manufacturing the gyro sensor of the embodiment (process of forming a wire groove and a concave portion).

Next, a process of manufacturing the gyro sensor 10 of the embodiment will be described. FIGS. 10 to 13 illustrate the process of manufacturing the gyro sensor of the embodiment. As illustrated in FIG. 10, the wire grooves 14, the concave portions 16, the convex portions 18, and the island portions 20 are formed by etching on the base substrate 12. In addition, etching is also performed up to the same depth as the wire groove 14 and the like on the position at which the inter-wire groove 54 of the base substrate 12 is formed. The concave portion 16 is formed according to the outer shapes of the drive spring 34, the drive mass portions 26A and 26B, the movable electrode 44, and the like. The convex portion 18 is formed by performing etching on an area in which the wire groove 14 and the concave portion 16 of the base substrate 12 are formed, except for a part which will be the convex portion 18. The island portion 20 is also formed by performing etching on an area in which the concave portion 16 of the base substrate 12 is formed, except for a part which will be the island portion 20.

Figure 11:
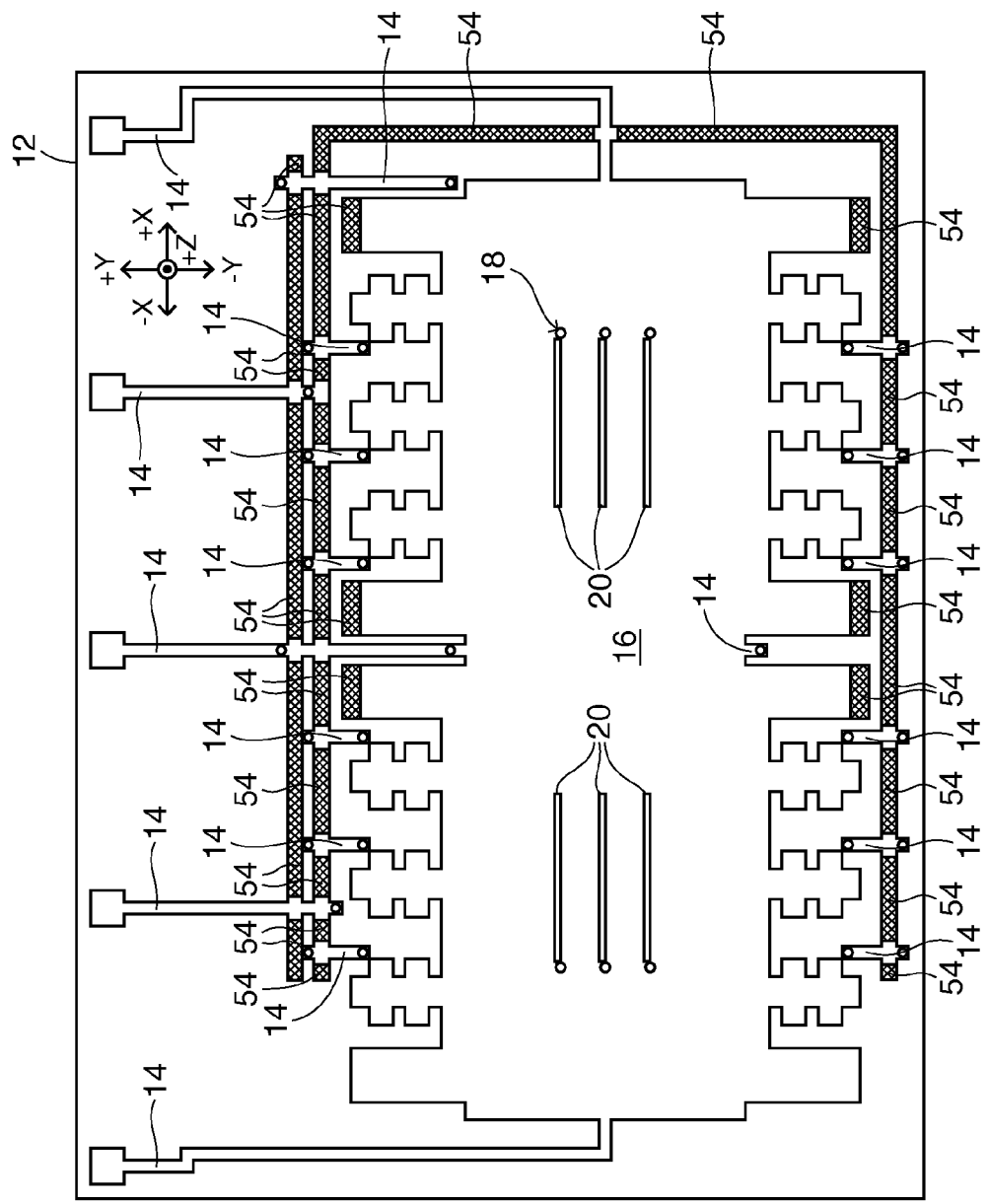
FIG. 11 is a view illustrating a process of manufacturing the gyro sensor of the embodiment (process of forming an inter-wire groove).

As illustrated in FIG. 11, the conductive film 22 and the external terminal 24 are formed using sputtering or the like. At this time, a mask covering a part other than the position at which the conductive film 22 of the base substrate 12 is formed is formed on the base substrate 12, and is removed after formation of the conductive film 22. This conductive film 22 is formed not only on the bottom surfaces of the wire groove 14 and the concave portion 16, but also on the upper surface of the convex portion 18.

Figure 12:
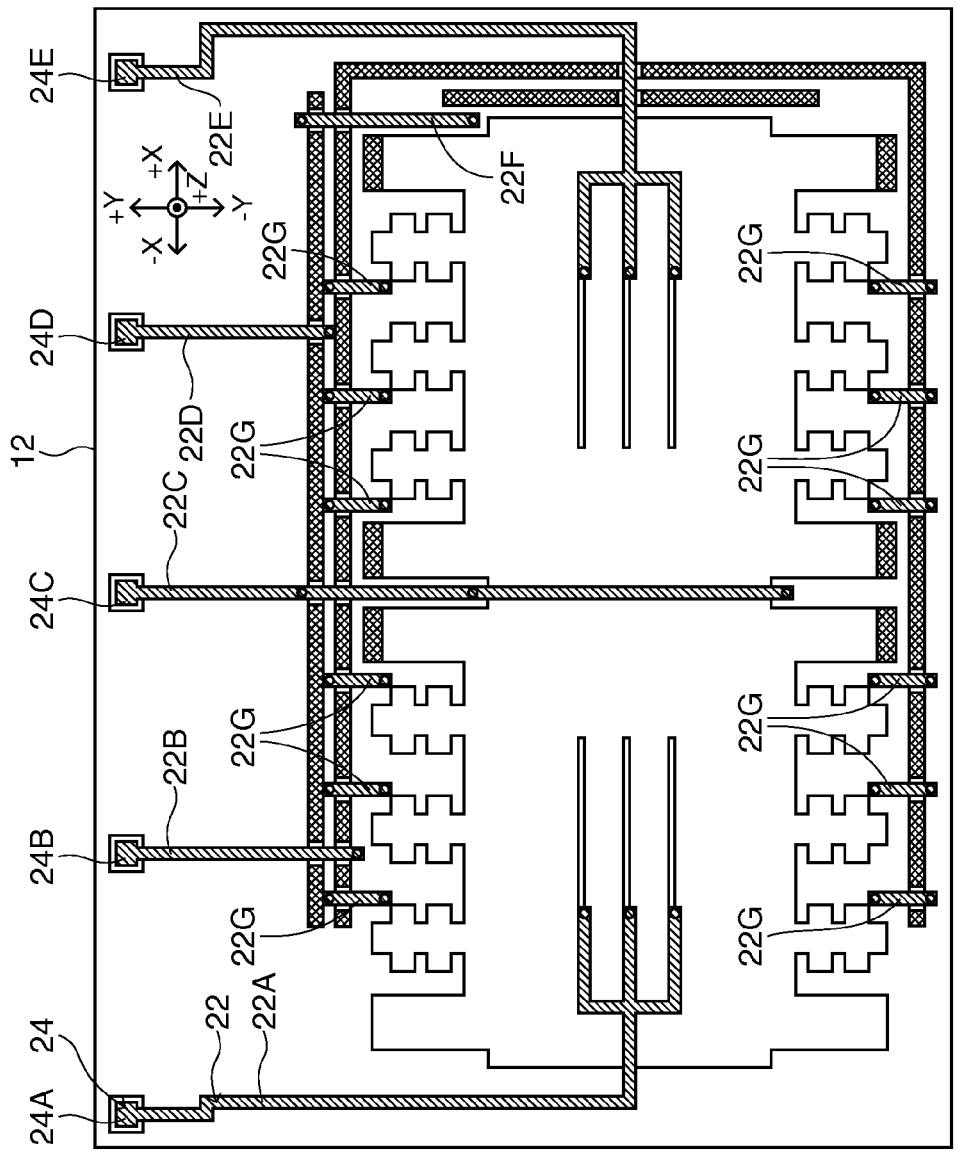
FIG. 12 is a view illustrating a process of manufacturing the gyro sensor of the first embodiment (process of forming a conductive film).

As illustrated in FIG. 12, the inter-wire groove 54 (or slit 56) is formed on the base substrate 12.

Figure 13:
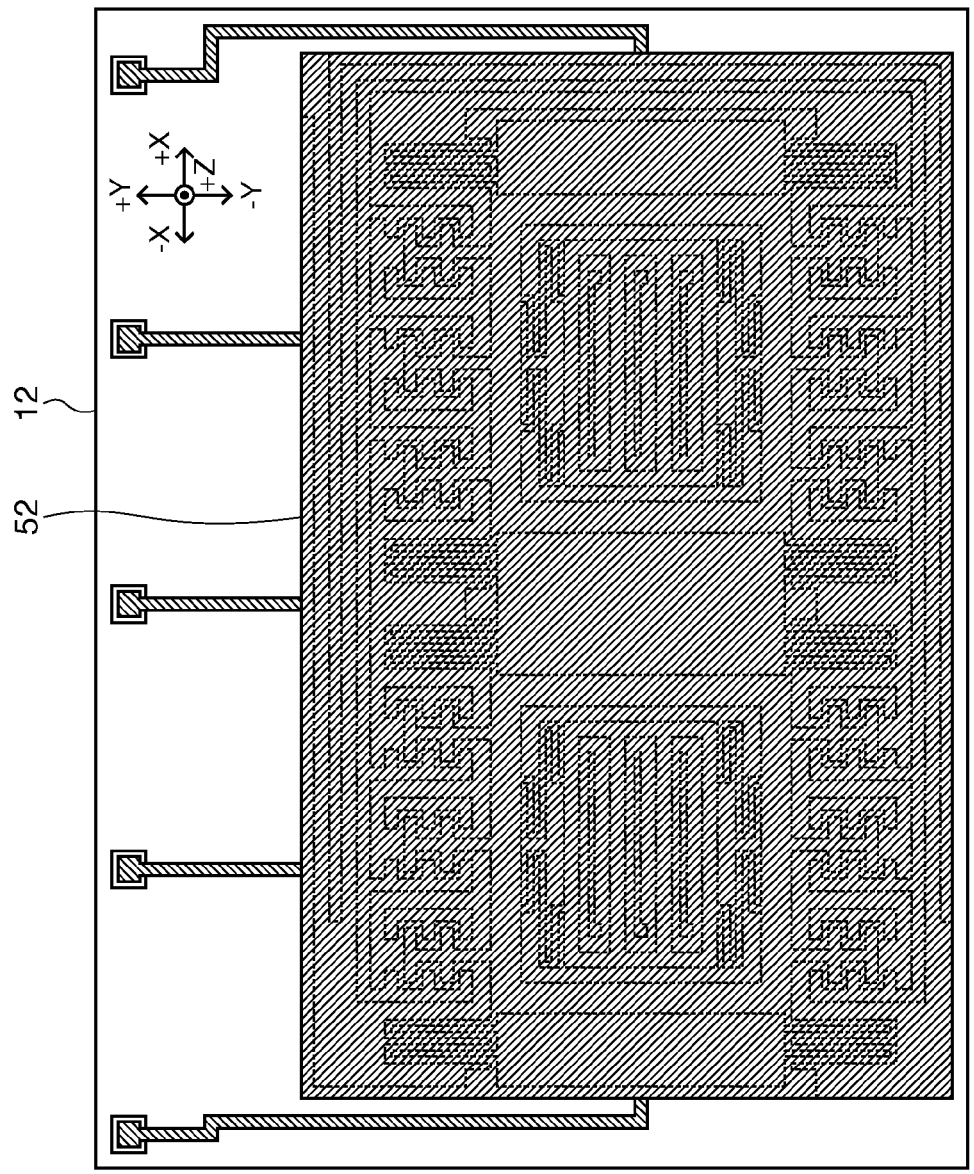
FIG. 13 is a view illustrating a process of manufacturing the gyro sensor of the first embodiment (anodic bonding process).

As illustrated in FIG. 13, the conductive silicon substrate 52 which is a material of the constituent elements (the anchor portion 32, the drive spring 34, the drive mass portions 26A and 26B, the movable electrode 44, the fixed electrodes 46A and 46B, the detecting spring 42, the movable mass portions 36A and 36B, the island-shaped electrodes 40A and 40B, and the semiconductor wire 50) is disposed on the base substrate 12 to be bonded to the base substrate 12 (glass substrate) through anodic bonding. Due to this bonding, apart disposed on the upper surface of the convex portion 18 in the conductive film 22 and the silicon substrate 52 are connected to each other, and the island portion 20 and the silicon substrate 52 are bonded to each other. When the constituent elements are die-cut by performing etching on an area other than the areas of the above-described constituent elements of the silicon substrate 52, the gyro sensor 10 of the embodiment is formed.

The inter-wire groove 54 (or slit 56) can also be formed after forming the semiconductor wire 50 through etching. For example, the base substrate 12 is formed by glass of SiO$_2$ and the semiconductor wire 50 is formed by die cutting by subjecting the silicon substrate 52 bonded to the base substrate 12 to etching. The area between the semiconductor wires 50 of the base substrate 12 is etched using HF or the like to form the inter-wire groove 54. At this time, the semiconductor wire 50 which becomes a peripheral edge of the area to be a target of etching can be used as a mask pattern. According to such a manufacturing process, it is possible to securely form the inter-wire groove 54 (or slit 56) between the semiconductor wires 50 without generating an alignment error which may occur when the inter-wire groove 54 is formed in advance on the base substrate 12 and the semiconductor wire 50 is then disposed on the base substrate 12.

In addition, as illustrated in FIG. 7 and the like, when the conductive film 22 is exposed on a position between the semiconductor wires 50 of the base substrate 12, the conductive film 22 can be used as a mask pattern together with the semiconductor wire 50. At this time, the conductive film 22 is preferably formed by a metal such as Cu or Au that is not etched by HF or the like.

In the process illustrated in FIG. 11, even when the height of the convex portion 18 is the same as the depth of the inter-wire groove 54, when a conductive film 22 which is formed on a side surface of a convex portion 18 and disposed on a upper surface of the convex portion 18 and a conductive film 22 which is disposed in a wire groove 14 in which the convex portion 18 is arranged are electrically connected to each other, the depth of the wire groove 14 can be made to be the same as that of the inter-wire groove 54, and the process illustrated in FIG. 12 can be omitted.

In the embodiment, a cap (not shown) is bonded to the base substrate 12 so as to cover the above-described constituent elements die-cut from the silicon substrate 52. Accordingly, instead of the slit 56 illustrated in FIG. 2, the inter-wire groove 54 is disposed on the base substrate 12 to seal the above-described constituent elements airtight. Therefore, it is possible to prevent contamination of the above-described constituent elements. In addition, for example, when the above-described constituent elements are vacuum-sealed, or sealed airtight while low-viscosity gas is replenished, the movement of the drive mass portions and the movable mass portions which are movable parts is made better and the excitation efficiency of the gyro sensor and the angular velocity detection sensitivity can be increased.

Figure 14:
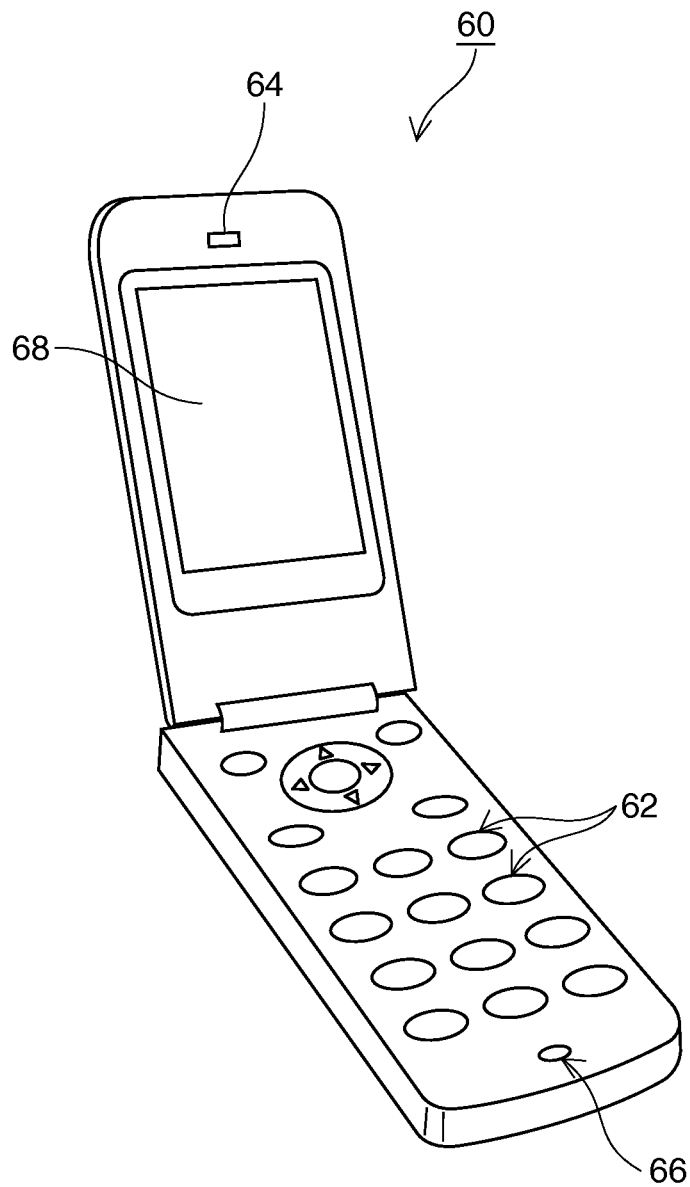
FIG. 14 is a schematic view of an electronic apparatus having the gyro sensor of the embodiment installed therein.

FIG. 14 illustrates a schematic view of an electronic apparatus (portables terminal) with the electronic component of the embodiment installed therein. In FIG. 14, a portable terminal 60 (including PHS) is provided with a plurality of operation buttons 62, an ear piece 64, and a mouthpiece 66, and a display 68 is disposed between the operation buttons 62 and the ear piece 64. Recently, such a portable terminal 60 is also provided with a camera with a blurring correction function. Accordingly, the gyro sensor 10 of the embodiment is built in the portable terminal 60 in order to detect the angular velocity which is used in the blurring correction function.

Examples of the electronic apparatus provided with the gyro sensor 10 of the embodiment and the like include high-function cell phones, digital still cameras, personal computers, laptop personal computers, tablet personal computers, TVs, video cameras, video tape recorders, car navigation systems, pagers, ink jet discharge apparatuses, electronic notebooks, calculators, electronic game machines, word processors, work stations, videophones, TV monitors for security, electronic binoculars, POS terminals, a medical apparatus (for example, electronic thermometers, manometers, blood glucose analyzers, electrocardiography instruments, ultrasonography instruments, and electronic endoscopes), fishfinders, various measurement systems, gauging instruments (for example, ones for automobiles, airplanes, and ships), flight simulators, and the like in addition to the portable terminal 60.

The entire disclosure of Japanese Patent Application No. 2012-089966, filed Apr. 11, 2012 is expressly incorporated by reference herein.

What is claimed is:

1. A semiconductor device comprising:
a base substrate;
first and second semiconductor wires which are arranged side by side on the base substrate;
a drive mass portion configured to be oscillated by a drive portion;
wherein the base substrate is provided with an opening in an extending direction of the first and second semiconductor wires between the first semiconductor wire and the second semiconductor wire;
the drive portion includes fixed electrodes and movable electrodes;
the first semiconductor wire is connected to the fixed electrodes; and
the second semiconductor wire is connected to the movable electrodes.

2. The semiconductor device according to claim 1, wherein a relationship of $D \geq 2W$ is satisfied where D represents a depth of the opening and W represents a width between a center portion of a width of the first semiconductor wire and a center portion of a width of the second semiconductor wire.

3. The semiconductor device according to claim 1, wherein a material of the first and second semiconductor wires is silicon.

4. The semiconductor device according to claim 1, wherein the opening has a bottom.

5. An electronic apparatus comprising:
the semiconductor device according to claim 1 which is installed therein.

6. The semiconductor device according to claim 1, wherein a capacitance of the semiconductor device is defined as:

$$\Delta C_1 = \frac{\varepsilon_0 \times S}{\sqrt{(i \times \Delta t)^2 + \left(\frac{W}{2}\right)^2}}, \qquad \text{Expression 1}$$

where $\varepsilon_0$ is a permittivity of a vacuum, S is an area of a lower surface of one of the first and second semiconductor wires per unit length of the one of the first and second semiconductor wires in a longitudinal direction, W is a width between center portions of the first and second semiconductor wires, t is a thickness of a portion of the substrate, and i is a number of the portions of the substrate.

* * * * *